(12) United States Patent
Hanafi

(10) Patent No.: US 7,745,295 B2
(45) Date of Patent: Jun. 29, 2010

(54) METHODS OF FORMING MEMORY CELLS

(75) Inventor: Hussein I. Hanafi, Basking Ridge, NJ (US)

(73) Assignee: Micron Technology, Inc., Boise, ID (US)

(*) Notice: Subject to any disclaimer, the term of this patent is extended or adjusted under 35 U.S.C. 154(b) by 294 days.

(21) Appl. No.: 11/945,160

(22) Filed: Nov. 26, 2007

(65) Prior Publication Data

US 2009/0134444 A1      May 28, 2009

(51) Int. Cl.
*H01L 21/336* (2006.01)

(52) U.S. Cl. .............. 438/287; 438/288; 438/527; 438/530; 438/593; 257/324; 257/411; 257/E29.309; 257/E21.18; 977/886; 977/936; 977/943

(58) Field of Classification Search .......... 438/287, 438/288, 527, 530, 593; 257/324, 411, E29.309, 257/E21.18; 977/886, 936, 943

See application file for complete search history.

(56) References Cited

U.S. PATENT DOCUMENTS

| | | | |
|---|---|---|---|
| 6,143,635 A | 11/2000 | Boyd et al. | |
| 6,251,729 B1 * | 6/2001 | Montree et al. | 438/257 |
| 6,353,249 B1 | 3/2002 | Boyd et al. | |
| 6,440,808 B1 | 8/2002 | Boyd et al. | |
| 6,475,863 B1 * | 11/2002 | Kim | 438/264 |
| 2002/0119630 A1 * | 8/2002 | Ueda | 438/301 |
| 2008/0191265 A1 * | 8/2008 | Mao et al. | 257/321 |
| 2009/0097320 A1 * | 4/2009 | Min et al. | 365/185.18 |

OTHER PUBLICATIONS

Tang, Shan, et al. "Nanocrystal Flash Memory Fabricated with Protein-mediated Assembly" IEEE © Aug. 2005 4 pages.
Hori, Takashi, et al. "A MOSFET with Si-implanted Gate-$SiO_2$ Insulator for Nonvolatile Memory Applications" Apr. 1992, IEEE pp. 17.7.1-17.7.4.
Hanafi, Hussein I., "70 nm Damascene-Gate MOSFETs with Minimal Polysilicon Gate-Depletion" Solid-State Device Research Conference, 2001. Proceedings of the 31st European Volume, Issue, Sep. 11-13, 2001 pp. 143-146.
Ishii, Tomoyuki, Engineering Variations: Toward Practical Single-Electron (Few-Electron) Memory) IEEE Electron Devices Meeting, 2000. IEDM Technical Digest. International Volume, Issue, 2000 pp. 305-308.

(Continued)

*Primary Examiner*—Tu-Tu V Ho
(74) *Attorney, Agent, or Firm*—Wells St. John P.S.

(57) ABSTRACT

Some embodiments include methods of forming memory cells. Dopant is implanted into a semiconductor substrate to form a pair of source/drain regions that are spaced from one another by a channel region. The dopant is annealed within the source/drain regions, and then a plurality of charge trapping units are formed over the channel region. Dielectric material is then formed over the charge trapping units, and control gate material is formed over the dielectric material. Some embodiments include memory cells that contain a plurality of nanosized islands of charge trapping material over a channel region, with adjacent islands being spaced from one another by gaps. The memory cells can further include dielectric material over and between the nanosized islands, with the dielectric material forming a container shape having an upwardly opening trough therein. The memory cells can further include control gate material within the trough.

15 Claims, 16 Drawing Sheets

OTHER PUBLICATIONS

Kim, Ilgweon, et al. "Room Temperature Single Electron Effects in Si Quantum Dot Memory with Oxide-Nitride Tunneling Dielectrics" IEEE Sep. 1998 pp. 5.2.1-5.2.4.

Takata, M. "New Non-Volatile Memory with Extremely High Density Metal Nano-Dots" IEEE May 2003, pp. 22.5.1-22.5.4.

Hanafi, Hussein I. et al. "Fast and Long Retention-Time Nano-Crystal Memory" IEEE transactions on Electron Devices vol. 43, No. 9, Sep. 1996 pp. 1553-1558.

King, Ya-Chin, et al., "Charge-Trap Memory Device Fabricated by Oxidation of $Si_{1-x}Ge_x$," IEEE Transactions on Electron Devices, vol. 48, No. 4 Apr. 2001 pp. 696-700.

Ostraat, Michele L., et al. "Ultraclean Two-Stage Aerosol Reactor for Production of Oxide-Passivated Silicon Nanparticles for Novel Memory Devices" Journal of the Electrochemical Society, 148 (g) G265-G270 (2001).

Liu, Zengtao, et al. "Metal Nanocrystal Memories—Part I: Device Design and Fabrication" IEEE Transactions on Electron Devices, vol. 49, No. 9 Sep. 2002; pp. 1606-1613.

De Blauwe, Jan, "Nanocrystal Nonvolatile Memory Devices" IEEE Transactions on Nanotechnology, vol. 1, No. 1, Mar. 2002, pp. 72-77.

Dutta, Achyut Kumar, "Visible photoluminescence from Ge nanocrystal embedded into a $SiO_2$ matrix fabricated by atmospheric pressure chemical vapor deposition" Applied Physics Letters 68 (9) Feb. 26, 1996 pp. 1189-1191.

* cited by examiner

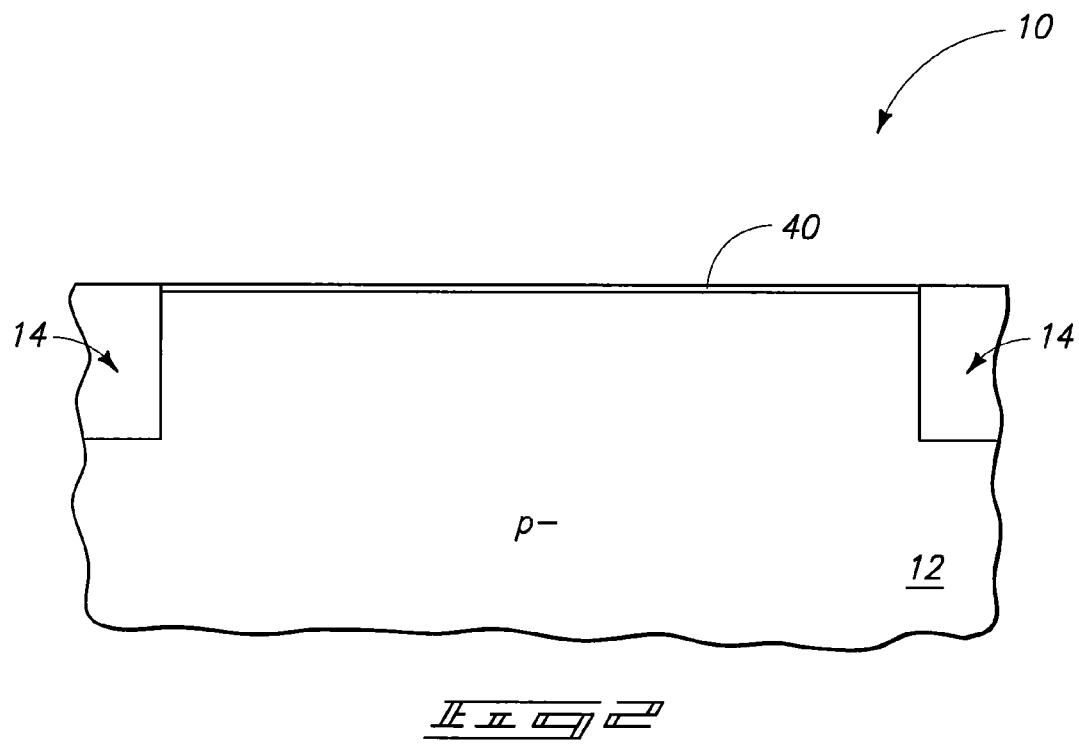
_Fig 2_
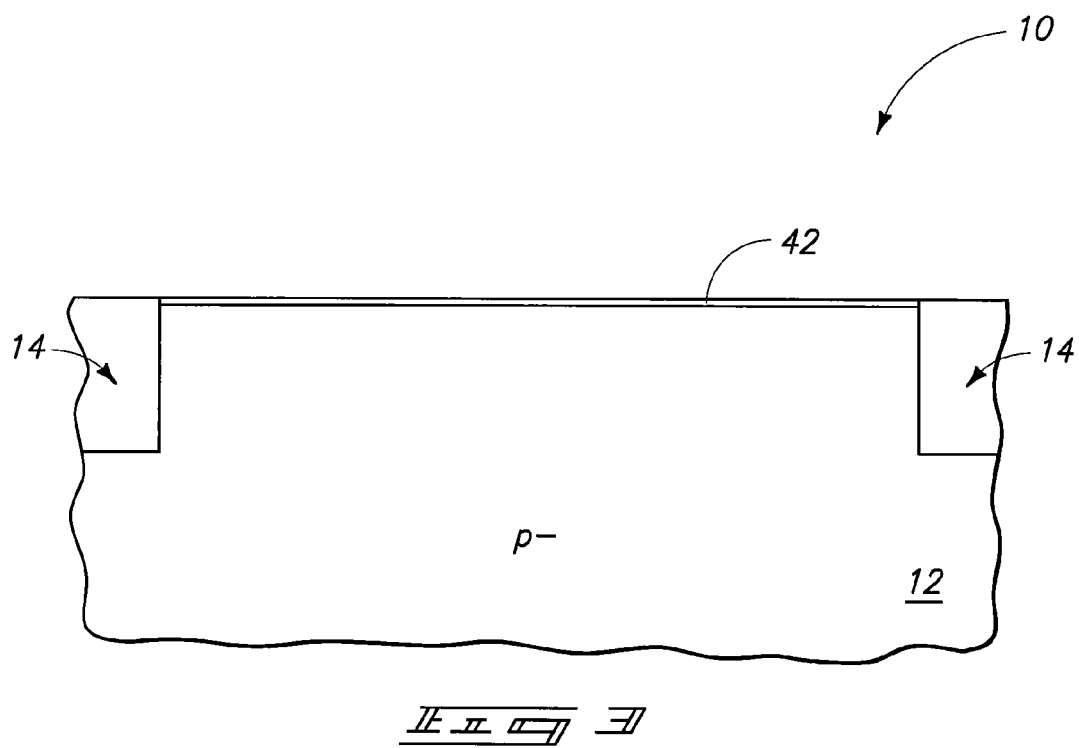
_Fig 3_

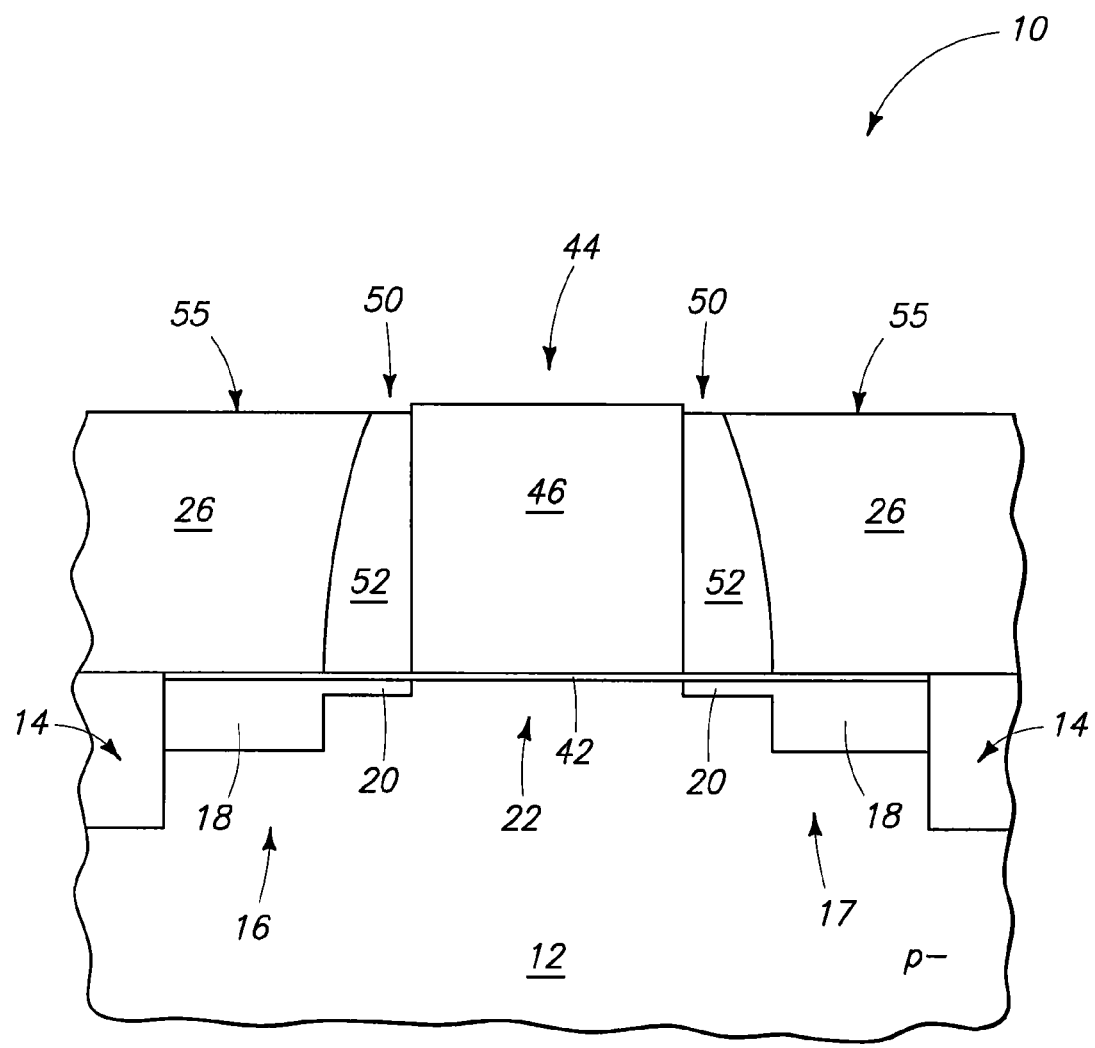
_FIG 8_

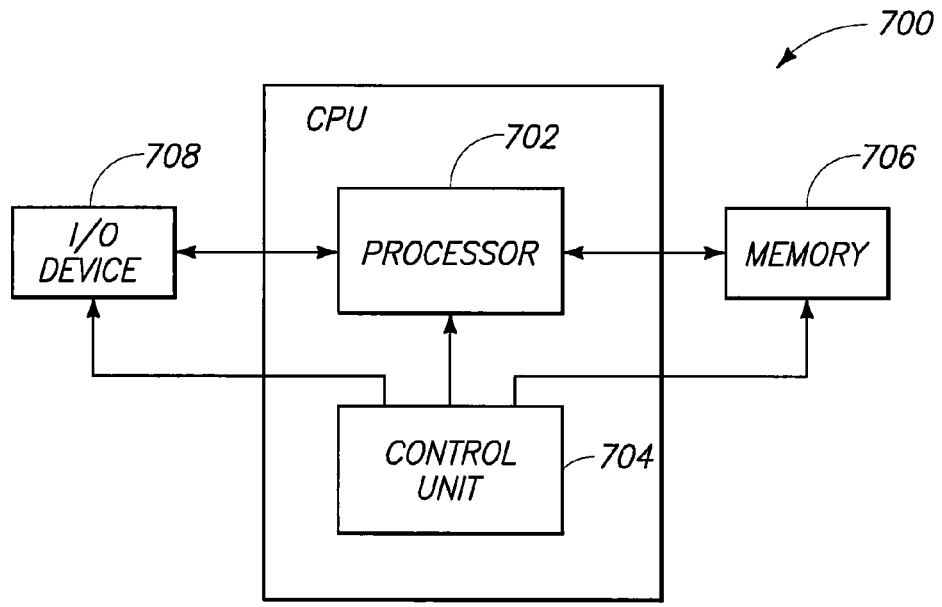
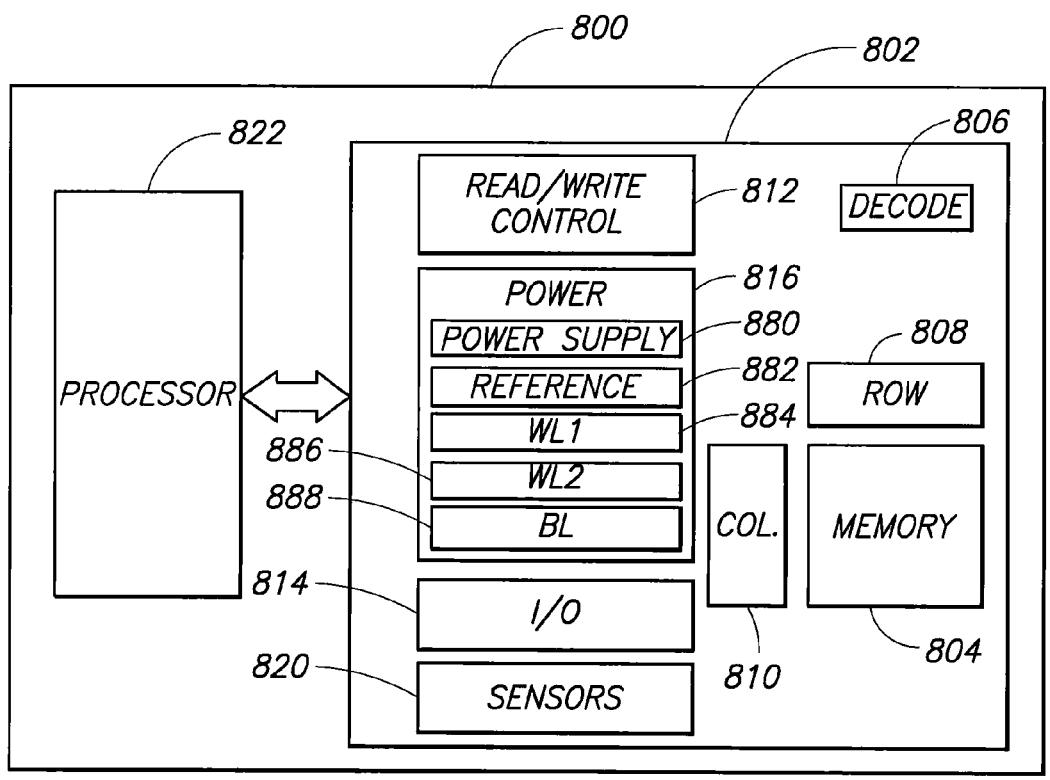

METHODS OF FORMING MEMORY CELLS

TECHNICAL FIELD

Memory cells, and methods of forming memory cells.

BACKGROUND

Memory devices provide data storage for electronic systems. One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Such a BIOS is sometimes called a flash BIOS. Flash memory is also popular in wireless electronic devices because it enables the manufacturer to support new communication protocols as they become standardized, and to provide the ability to remotely upgrade the devices for enhanced features.

A typical flash memory comprises a memory array that includes a large number of non-volatile memory cells arranged in row and column fashion. The cells are usually grouped into blocks. Each of the cells within a block may be electrically programmed by charging its floating gate. The charge may be removed from the floating gate by a block erase operation.

NAND is a basic architecture of flash memory. A NAND cell unit comprises at least one select gate coupled in series to a serial combination of memory cells (with the serial combination being commonly referred to as a NAND string). The gates of the NAND string have traditionally been single level cells (SLCs), but manufacturers are transitioning to utilization of multilevel cells (MLCs) for gates of NAND strings. An SLC stores only one data bit, whereas an MLC stores multiple data bits. Accordingly, memory array density can be at least doubled by transitioning from SLCs to MLCs.

Regardless of whether devices are utilized as MLCs or SLCs, there are continuing goals to avoid parasitic capacitive coupling effects and stress-induced gate leakage, and to have a large memory window (with a memory window being the charge window that enables a non-volatile cell to be charged, and being defined by how much charge is placed on the cell within a given time). A large memory window may enable the multiple memory states of an MLC device to be clearly separated from one another.

Nanocrystal floating gate flash memories have attracted interest in recent years for their advantages over traditional EEPROMs. Using nanocrystals or quantum dots acting as a charge trapping material embedded between the control oxide and tunnel oxide may significantly improve the nonvolatile charge retention time due to the effects of Coulomb blockade, quantum confinement, and reduction of charge leakage from weak spots in tunnel oxide. In addition, nanocrystal floating gate flash memories may improve flash EEPROMs in other areas, such as device scaling, erase/write/read speed, operating power and device lifetime.

Two important factors with embedded nanocrystal synthesis may be (1) the method of deposition of the nanocrystals, and (2) the size and distribution of the nanocrystals. Some methods of nanocrystal deposition include precipitation of nanocrystals from ion-implanted or silicon-rich oxide layers, aerosol deposition, chemical vapor deposition (CVD), and physical vapor deposition (PVD). These methods may be compatible with conventional CMOS high-temperature front end of the line processing but may be only limited to semiconductor type nanocrystals, rather than being also compatible with metal-containing nanocrystals, and may enable only limited control of nanocrystal size and distribution.

A new method has been developed for deposition of nanocrystals which utilizes chaperonin protein to form a template for retaining nanocrystals in desired orientations. The chaperonin-based method may enable formation of high-density nanocrystals with good distribution uniformity. However, it is difficult to incorporate protein-based methods into existing semiconductor fabrication processes.

It is desired to develop fabrication processes which enable homogeneous distribution of nanocrystals within nonvolatile memory cells. Is also desired to develop new memory cell structures which may take advantage of incorporation of nanocrystals therein.

BRIEF DESCRIPTION OF THE DRAWINGS

FIG. 1 is a diagrammatic, cross-sectional view of a portion of a semiconductor wafer illustrating an embodiment of a memory cell.

FIGS. 2-14 are diagrammatic, cross-sectional views of a portion of a semiconductor wafer illustrating example process stages that may be utilized to fabricate the memory cell of FIG. 1.

FIG. 18 is a high level block diagram of an electronic system embodiment.

FIG. 19 is a simplified block diagram of a memory device embodiment.

DETAILED DESCRIPTION OF THE ILLUSTRATED EMBODIMENTS

Figure 2:
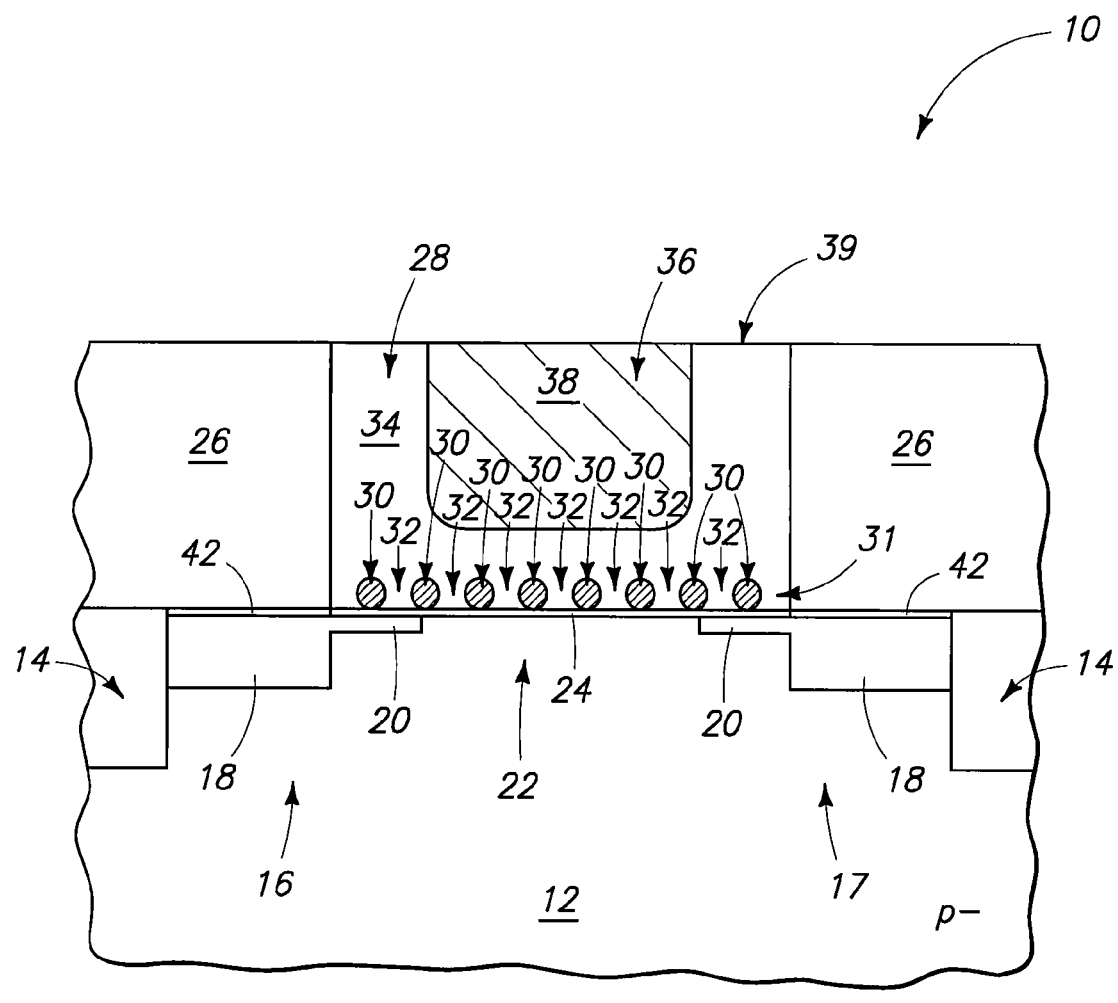

A difficulty associated with utilization of nanocrystals (or nanosized particles in general) in nonvolatile memory cells is that many nanocrystal compositions are incompatible with temperatures utilized during annealing of dopant of the memory cells. Such can be particularly problematic when utilizing metallic materials for the nanocrystals. For purposes of interpreting this disclosure and the claims that follow, nanosized particles are structures less than or equal to about 1000 nanometers along a maximal cross-section, and frequently less than 10 nanometers, or even less than 3 nanometers along a maximal cross-section. In some embodiments, the nanosized particles may have maximal cross-sectional dimensions of from about 1 nanometer to about 100 nanometers. The nanosized particles may be configured to trap less than or equal to about 20 charges, and may, for example, be configured to trap from about one charge to about 20 charges. The nanosized particles may be substantially spherical, and in such embodiments may be referred to as nanodots. The nanosized particles may be substantially or entirely crystalline, and in such embodiments may be referred to as nanocrystals.

In some embodiments, damascene gate methods are used to provide a process integration scheme for incorporation of nanosized charge traps into nonvolatile memory cells such that dopant anneal occurs prior to provision of the nanosized charge traps. In such damascene methods, a nanocrystal array, control oxide and control gate may be deposited in a groove formed by removing a dummy gate.

As technologies scale to smaller dimensions, gate lengths of nonvolatile memory cell gates get shorter, and accordingly the control gate and nanocrystal array occupy an increasing fraction of the above-discussed groove. In addition, the gates may tend to have rounded bottoms, so that only center regions of the gates have full control of underlying channels. The presence of a gap between a source/drain extension and a gate edge may increase on-resistance of the memory cell transistor, which may degrade performance of the memory cell. In some embodiments, such problem is addressed with the use of a dummy spacer. Such dummy spacer is formed along a sidewall of the dummy gate. The dummy spacer allows the groove to be made wider, for a given gate length, while also allowing accurate placement of the source/drain extension edges inside the groove to eliminate a gap between the source/drain extensions and the actual gate. The wider groove may facilitate introduction of nanocrystalline material and control oxide.

FIG. 1 illustrates a portion of a semiconductor construction 10 showing an example memory cell embodiment. The construction includes a semiconductor base 12. Base 12 may comprise, consist essentially of, or consist of monocrystalline silicon, and may be referred to as a semiconductor substrate, or as a portion of a semiconductor substrate. In the shown embodiment, the base is lightly doped with p-type dopant (specifically, is shown to be "p-" doped). The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of refractory metal layers, barrier layers, diffusion layers, insulator layers, etc.

Trenched isolation regions 14 extend into base 12. The isolation regions may correspond to shallow trench isolation regions, and may comprise any suitable electrically insulative material, or combination of electrically insulative materials. For instance, the isolation regions may comprise a combination of silicon nitride and silicon dioxide.

A pair of source/drain regions 16 and 17 extend into base 12. The source/drain regions comprise heavily-doped portions 18 and lightly-doped extensions 20. The heavily-doped regions may comprise dopant to a concentration of at least about $10^{20}$ atoms/cm$^3$, and the lightly-doped extensions may comprise dopant to a concentration of less than or equal to about $10^{19}$ atoms/cm$^3$. The dopant of the heavily-doped regions may be either p-type or n-type. At least some of the dopant of the lightly-doped extensions will be the same type as that of the heavily-doped regions. Additionally, some of the dopant of the lightly-doped extensions may be the opposite type to that of the heavily-doped regions (with n-type and p-type being opposites of one another) if halo regions are present.

A channel region 22 extends between the source/drain regions 16 and 17. The channel region may be doped with threshold voltage dopant.

Tunnel dielectric 24 is over the channel region. The tunnel dielectric may comprise any suitable composition or combination of compositions. In some embodiments, the tunnel dielectric may comprise, consist essentially of, or consist of one or more oxides, such as, for example, silicon dioxide. In such embodiments, the tunnel dielectric may be referred to as tunnel oxide.

A thin layer of insulative material 42 is over base 12, and a thick layer of electrically insulative material 26 is over layer 42. Material 42 may, for example, comprise, consist essentially of, or consist of silicon dioxide.

Electrically insulative material 26 may comprise any suitable composition or combination of compositions; and may, for example, comprise, consist essentially of, or consist of silicon nitride. Material 26 has a thickness over base 12, and such thickness may, for example, be from about 100 angstroms to about 1000 angstroms.

An opening 28 extends through material 26, and memory cell gate materials are formed within such opening. Specifically, a plurality of charge trapping units 30 are within the opening and over tunnel dielectric 24. The charge trapping units may be nanosized islands, and may correspond to nanocrystals and/or nanodots. The charge trapping units may comprise any suitable composition or combination of compositions; and in some embodiments may comprise, consist essentially of, or consist of metal.

The charge trapping units form a charge trapping zone 31 over channel region 22. The trapping energy associated with individual nanodots, the amount of charge retained on individual nanodots, and the charge storage density of a zone of nanodots, may be related to the size, composition, population density, and homogeneity of distribution of the nanodots. The trap depth and amount of retained charge may result from quantum confinement and coulomb blockade, at least when the nanodots have a diameter of from about 1 nanometer to about 10 nanometers.

Quantum confinement describes how the electronic properties—the organization of energy levels into which electrons can climb or fall—change when a nanoparticle is sufficiently small in size. This size is typically 10 nanometers (nm) or less. Specifically, the phenomenon results from electrons and holes being squeezed into a dimension that approaches a critical quantum measurement, called the "exciton Bohr radius." The larger the particle size, the lower the ground state and, therefore, the longer the charge can be retained. The smaller the particle size, the more easily the electron stays in a shallow energy level so that it can come out more readily.

Coulomb blockade is the suppression of current, at low bias, due to the opposing electrostatic field created by the presence of an elementary charge. A nanoparticle becomes a charge center when it attracts a charge. A nanoparticle can capture multiple electrons. However, every time an electron is captured, the electrostatic field around the nanoparticle builds up to the point where it repels other electrons, thereby inhibiting transport and storage of electrons. Thus, additional incoming electrons come with a higher energy state, and consequently may leak out. Therefore, the more electrons that are captured by a nanodot, the lower the charge retention time of some of the electrons.

In the shown embodiment, the charge trapping units are uniformly distributed over the channel region, and are separated from one another by gaps 32. A dielectric material 34 extends across the charge trapping units and within the gaps. Dielectric material 34 may comprise any suitable composition or combination of compositions; and in some embodiments may comprise, consist essentially of, or consist of one or more oxides, such as, for example, silicon dioxide.

The dielectric material 34 forms a container shape within opening 28, and such container shape defines an upwardly-opening trough 36 therein. Control gate material 38 is within such upwardly-opening trough. The control gate material may comprise any suitable electrically conductive composition or combination of compositions, and may, for example, comprise one or more of metal (for instance, aluminum, titanium, tungsten, etc.), metal-containing compositions (for instance, metal nitride, metal silicide, etc.) and conductively-doped semiconductor material (for instance, conductively-doped silicon, conductively-doped germanium, etc.). As discussed below, an advantage of some embodiments may be that high-temperature annealing of dopant occurs prior to formation of the control gate. In such embodiments, the control gate may comprise materials that would otherwise be negatively affected by the high-temperature annealing, such as various metals and metal-containing compositions.

In the embodiment of FIG. 1, the control gate material 38 is entirely laterally contained within the trough 36 defined by container-shaped dielectric material 34. In other words, the control gate material does not extend laterally beyond the trough. Also in the shown embodiment, a planarized upper surface 39 extends across materials 26, 34 and 38. Such planarized upper surface may result from, for example, chemical-mechanical polishing (CMP).

The memory cell of FIG. 1 may be formed by any suitable processing. An example process is described with reference to FIGS. 2-14. In referring to FIGS. 2-14, identical numbering will be utilized as is used to describe FIG. 1, where appropriate.

FIG. 2 shows construction 10 at a process stage where the construction comprises base 12 and trenched isolation regions 14 extending into the base. The trenched isolation regions may be formed as follows. Initially, a mask of silicon nitride over pad oxide may be formed over base 12, and the mask may then be patterned to define locations for the trenched isolation regions. The trenches of the isolation regions may be formed in such locations, and then filled with desired dielectric materials. Subsequently, the silicon nitride of the mask may be removed to leave the shown construction comprising pad oxide 40 over base 12 and extending between trenched isolation regions 14. The pad oxide may comprise, consist essentially of, or consist of silicon dioxide; and may be about 8 nanometers thick.

FIG. 3 shows construction 10 at a process stage after the pad oxide 40 (FIG. 2) has been stripped from over base 12 and replaced with sacrificial material 42. The sacrificial material 42 may comprise, consist essentially of, or consist of silicon dioxide, and may be formed to a thickness of about 6 nanometers. If material 42 consists of silicon dioxide, such may be formed by atomic layer deposition (ALD), CVD, or thermal oxidation of an upper surface of base 12. The removal of the pad oxide and replacement of such oxide with sacrificial oxide 42 may remove contaminants that might be present on an upper surface of base 12.

Figure 4:
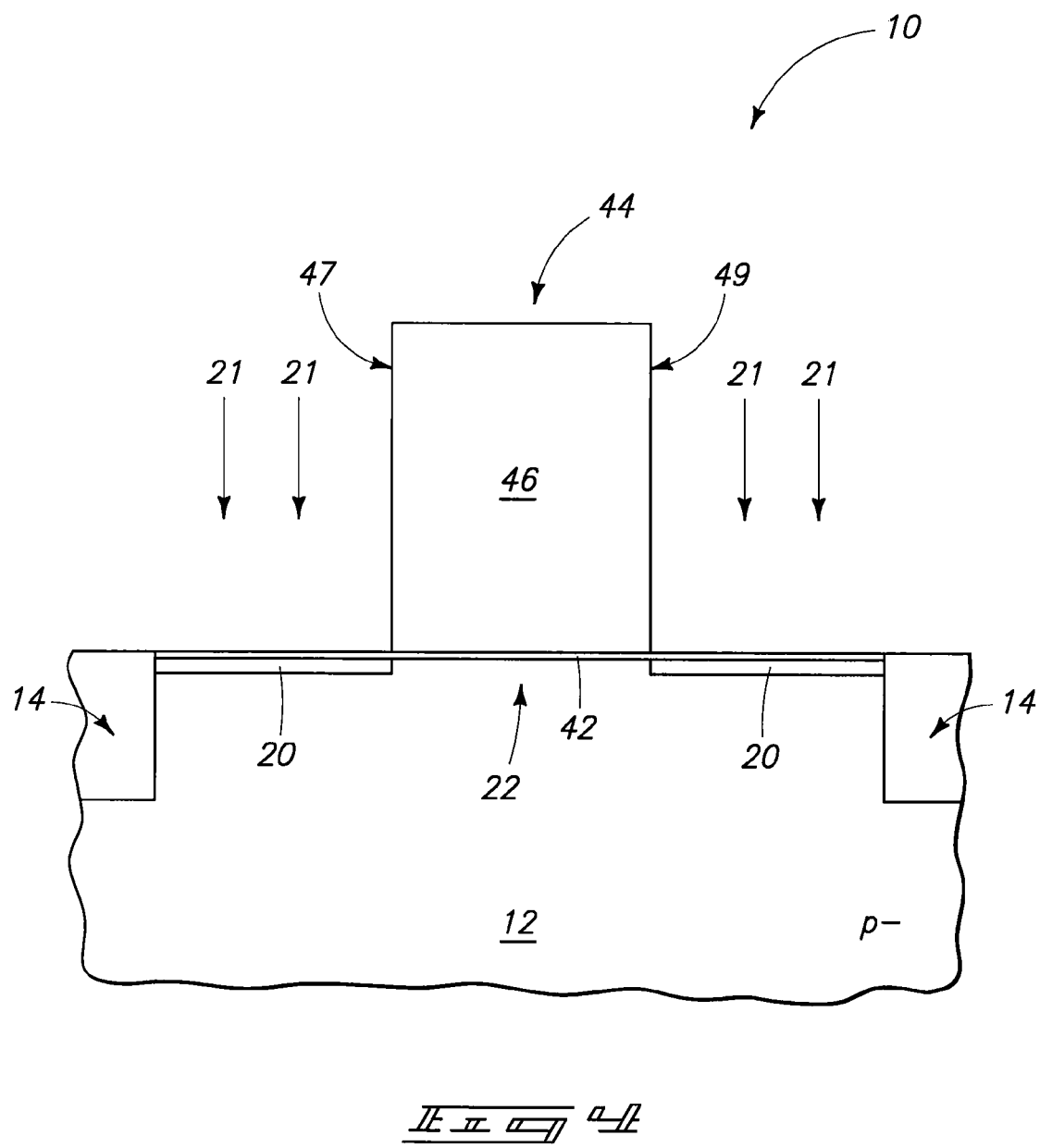

Referring to FIG. 4, a sacrificial structure 44 is formed over base 12, and in the shown embodiment is formed directly against sacrificial dielectric material 42. Structure 44 holds a location of a transistor gate, and may be referred to as a dummy gate. The sacrificial structure 44 comprises a material 46. In the shown embodiment, material 46 is homogeneous, but in other embodiments the material may comprise two or more distinct layers. Material 46 may comprise any suitable composition or combination of compositions; and may, for example, comprise, consist essentially of, or consist of silicon (for instance, polycrystalline silicon). Structure 44 may be patterned by initially providing a layer of material 46 over base 12, forming a photolithographically-patterned photoresist mask over the material 46, transferring a pattern from the photoresist mask to material 46 to form the structure 44, and then removing the photoresist mask.

The structure of 44 comprises a pair of opposing sidewalls 47 and 49.

Dopant 21 is implanted into base 12 while using structure 44 as a mask. The implant of dopant 21 forms lightly-doped source/drain extensions 20. Accordingly, the lightly-doped extensions 20 are aligned relative to the sidewalls 47 and 49 of sacrificial structure 44. At least a portion of the doped regions 20 will correspond to lightly-doped diffusion regions (in other words, will be of the same dopant type as heavily-doped source/drain regions 18 of FIG. 1). Additionally, a portion of the doped regions 20 may comprise halo regions (in other words, may be of the opposite dopant type as heavily-doped source/drain regions 18 of FIG. 1). The doped regions 20 are spaced from one another by a channel region 22 that is under structure 44.

Figure 5:
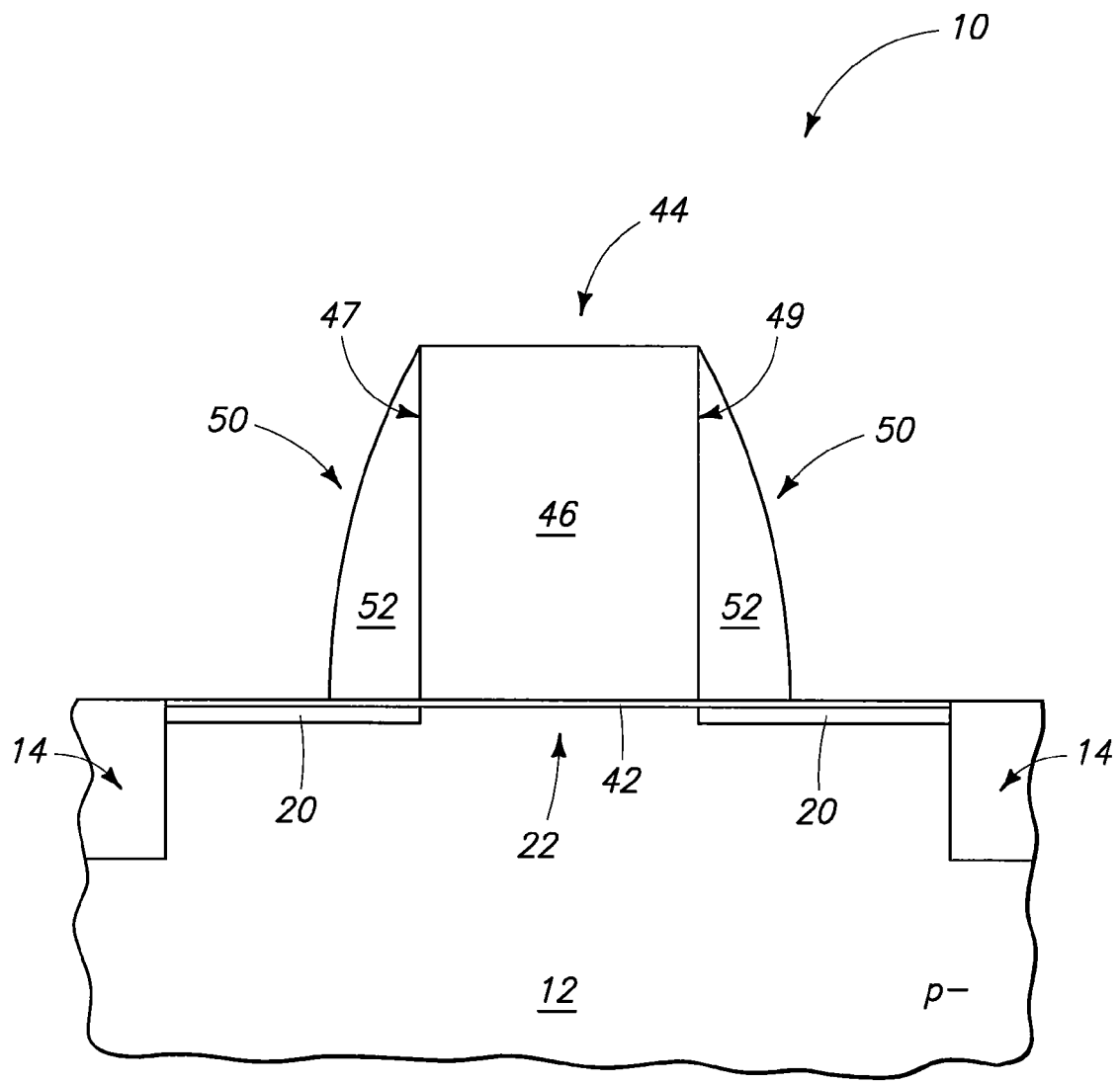

Referring to FIG. 5, sacrificial structures 50 are formed along the opposing sidewalls of 47 and 49 of sacrificial structure 44. In some embodiments, sacrificial structure 44 may be referred to as a first sacrificial structure, and sacrificial structures 50 referred to as second sacrificial structures to distinguish the structures 50 from the structure 44.

Structures 50 comprise a material 52. Such material is shown to be homogeneous, but in other embodiments may comprise two or more distinct layers. Material 52 may be any suitable composition or combination of compositions; and in some embodiments may comprise, consist essentially of, or consist of silicon dioxide.

Structures 50 are shown as spacers along the sidewalls 47 and 49 of structure 44. Such spacers may be formed by providing a layer of material 52 over base 12, along sidewalls 47 and 49, and over a top of structure 44; and subsequently anisotropically etching the material to remove the material from over the top of structure 44 and from over most of base 12, while leaving the shown spacers.

Figure 6:
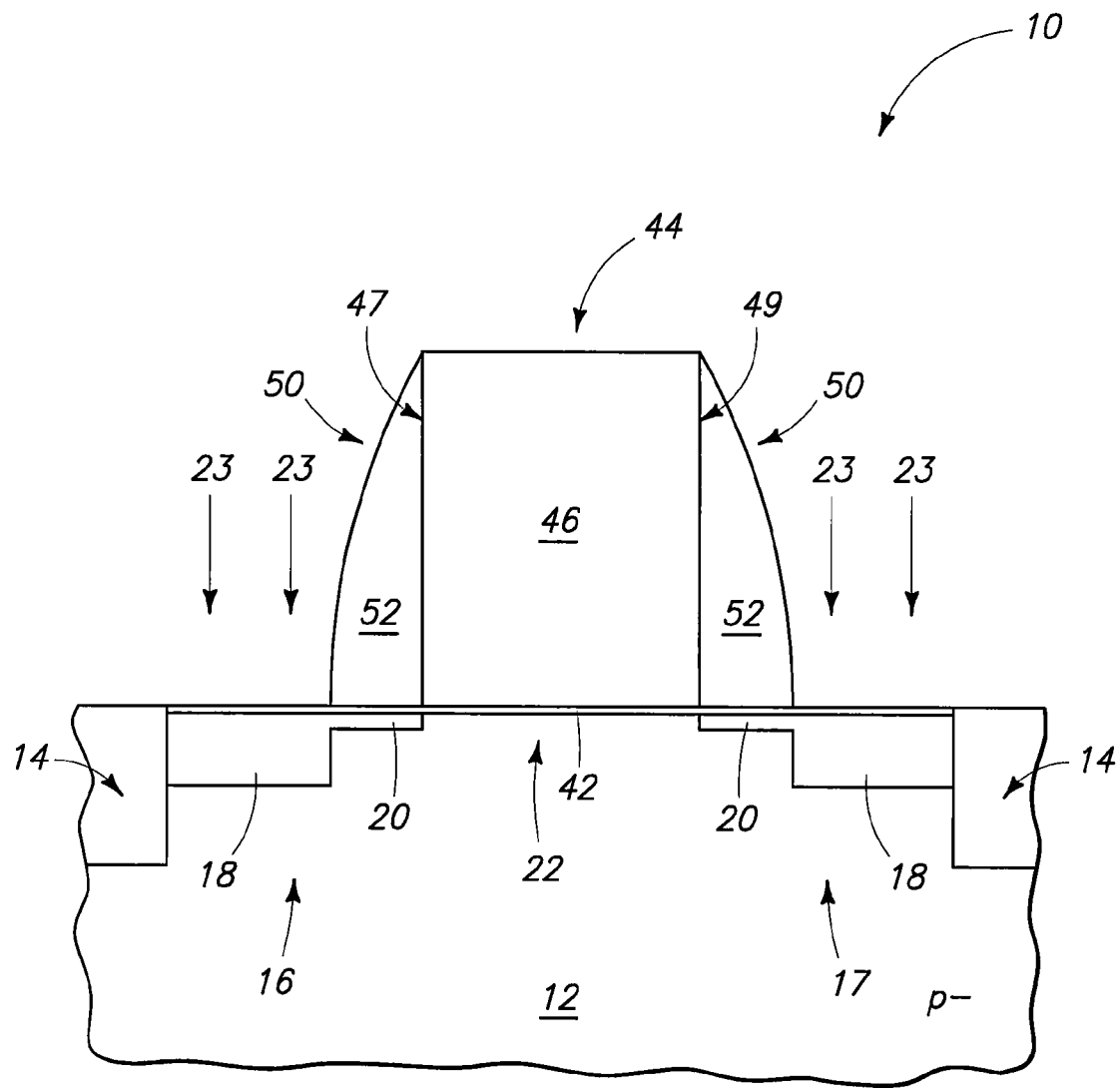

Referring to FIG. 6, sacrificial structures 44 and 50 are utilized as a mask during implant of dopant 23 to form heavily-doped source/drain portions 18 of source/drain regions 16 and 17. In the shown embodiment, the heavily-doped portions would be n-type majority doped; but in other embodiments the background doping may be n-type, and the heavily-doped portions may be p-type doped.

In some embodiments the sacrificial structure 44 of FIG. 5 may be referred to as a first mask utilized during implant of the source/drain extensions, and the combined structures 44 and 50 of FIG. 6 may be referred to as a second mask utilized during implant of the heavily-doped portions of the source/drain regions.

The dopant within source/drain regions 16 and 17 may be annealed at the processing stage of FIG. 6 by, for example, exposing the dopant to a temperature of at least about 1000° C. for a time of about 5 seconds. In some embodiments additional dopant will be provided subsequent to the processing stage of FIG. 6, and in such embodiments it may be desirable to wait until all of the dopant has been provided within base 12 before conducting the high temperature anneal of the dopant.

Figure 7:
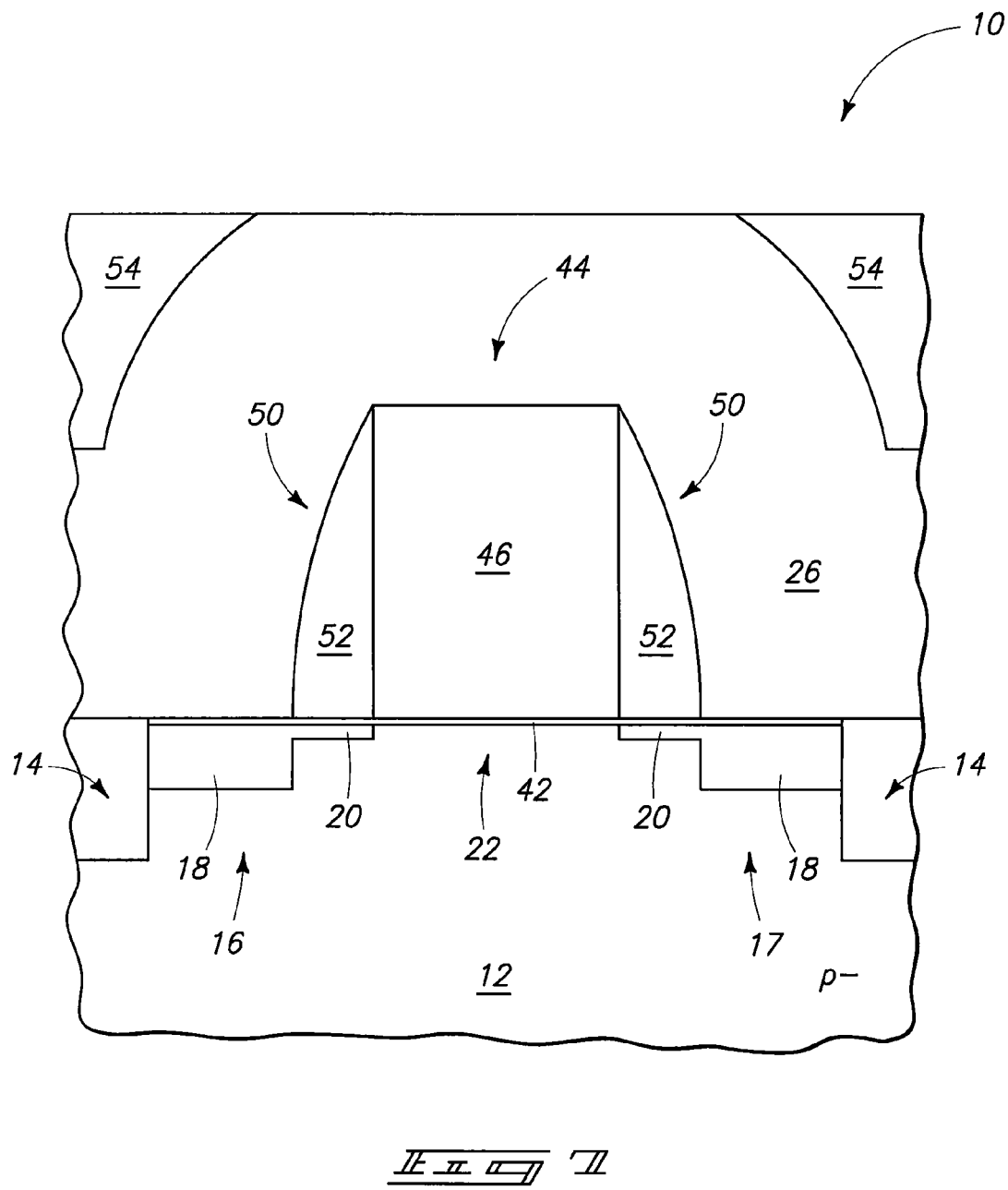

Referring to FIG. 7, electrically insulative material 26 is formed across base 12 and over sacrificial structures 44 and 50. The portion of the electrically insulative material that is laterally adjacent sacrificial material 52 may be considered to be laterally along structures 44 and 50.

The material 26 has an undulating topography at the processing stage of FIG. 7. A filler material 54 is provided over material 26 to at least partially fill valleys of the undulating topography, which can improve subsequent planarization of material 26.

Referring to FIG. 8, construction 10 is shown after planarization across materials 26, 52 and 46. Such planarization has entirely removed the filler material 54 (FIG. 7). The planarization may comprise, for example, CMP. In the shown embodiment, the planarization has formed a substantially planar surface 55 extending across materials 26, 52 and 46; with materials 26 and 52 being slightly more recessed than material 44. Such may occur if material 26, 52 and 46 comprise silicon nitride, silicon dioxide, and polycrystalline silicon, respectively. In other embodiments, substantially planar surface 55 may not comprise the shown recessing of surfaces of materials 26 and 52 relative to the surface of material 44.

Figure 9:
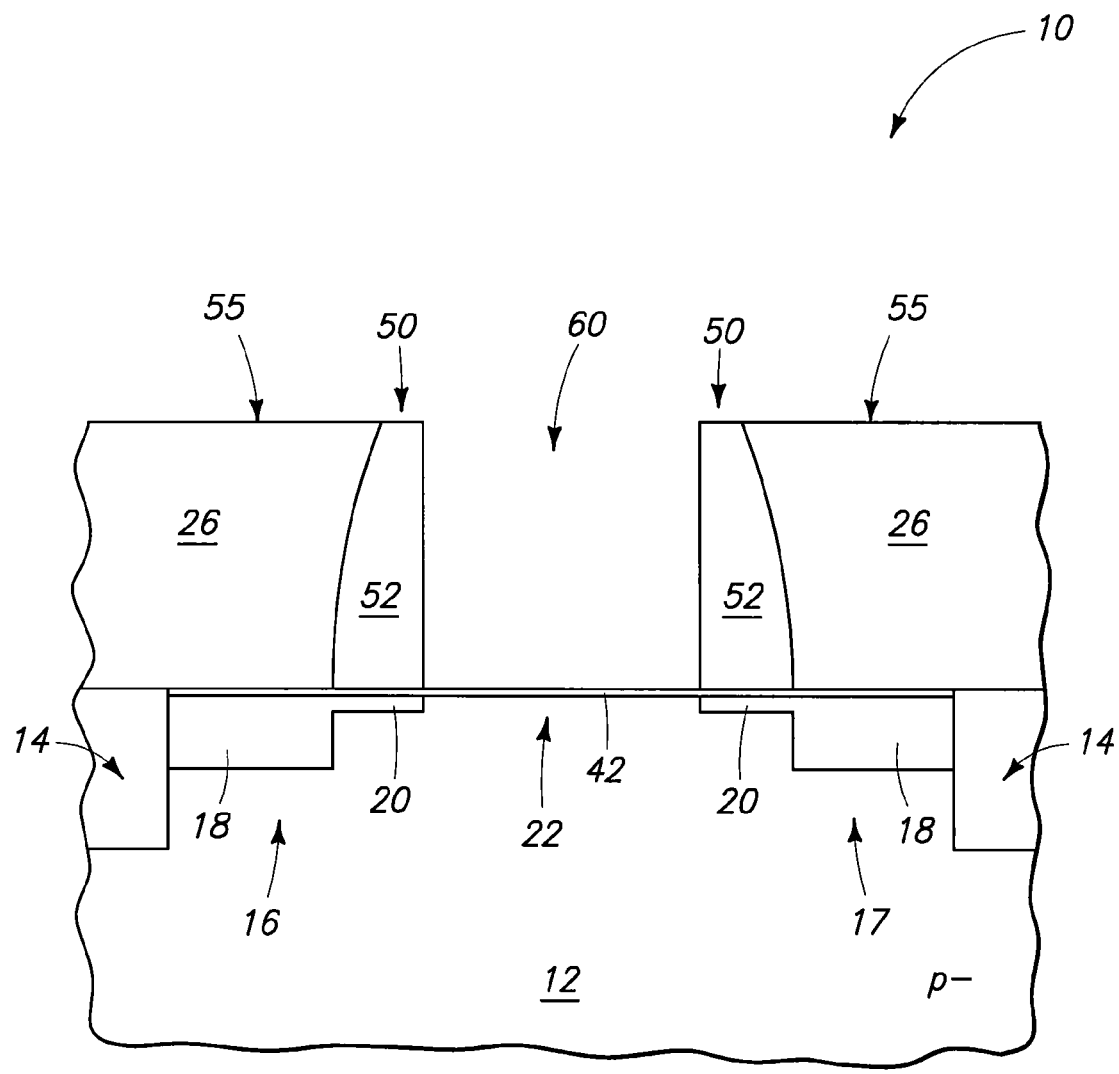

The planarization of material 26 has exposed sacrificial structure 44. Referring to FIG. 9, the sacrificial structure 44 (FIG. 8) is removed with an etch selective for material 46 relative to materials 26 and 52. An etch is selective for a first material relative to a second material if the etch removes the first material at a faster rate than it removes the second material, which can include, but is not limited to, an etch that is 100% selective for a first material relative to a second material.

The removal of structure 44 forms an opening 60 extending between sacrificial structures 50 and to sacrificial oxide 42. Opening 60 is directly over at least a portion of channel region 22.

Figure 10:
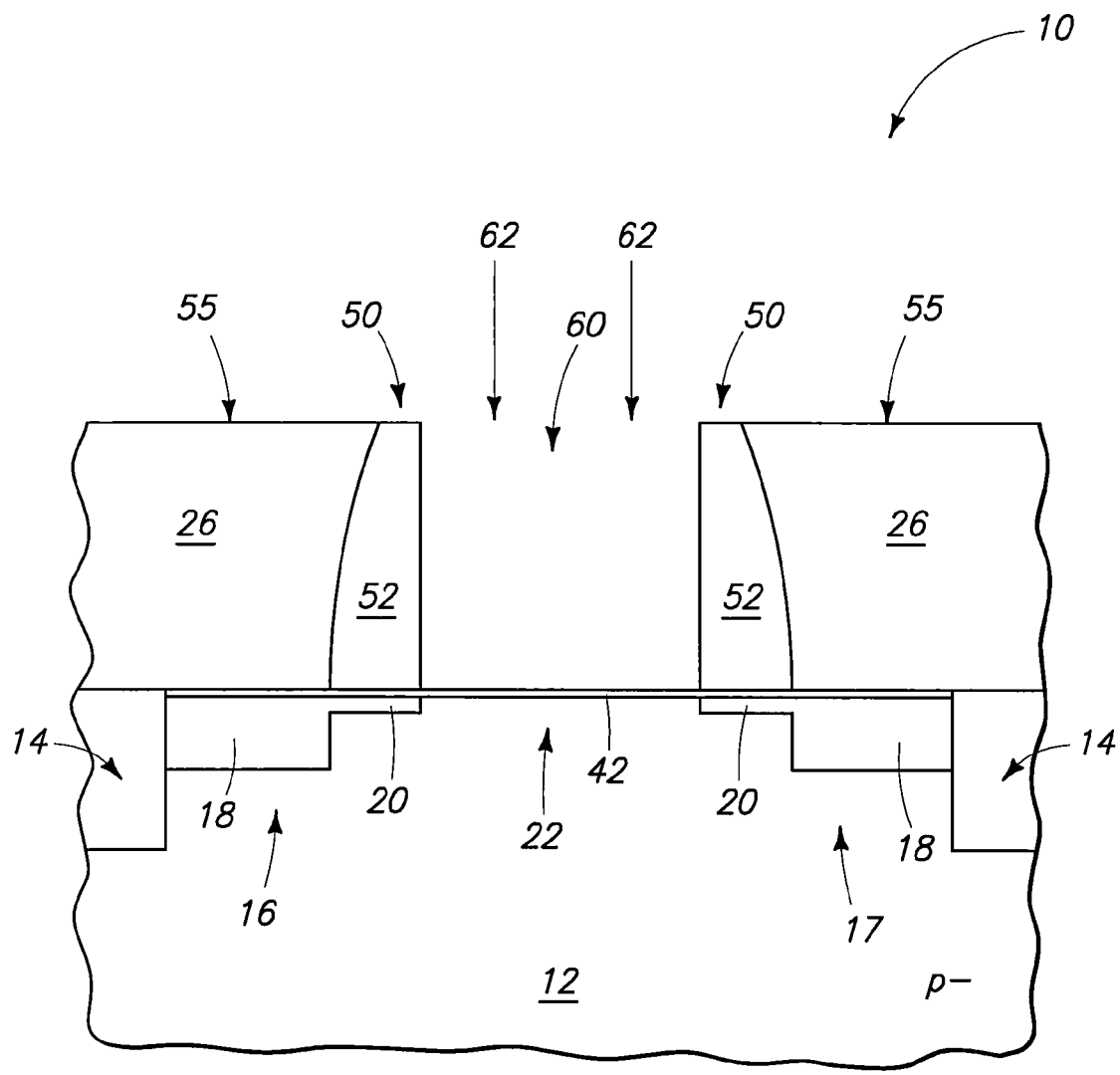

Referring to FIG. 10, dopant 62 is implanted into opening 60 while using materials 26 and 52 as a mask. Dopant 62 forms a threshold voltage implant region (not shown) within channel region 22. In some embodiments, dopants 21 (FIG. 4), 23 (FIG. 6) and 62 may be referred to as first, second and third dopants respectively.

The doped regions of construction 10 may be annealed after formation of the threshold voltage implant region utilizing a temperature of at least about 1000° C. for a time of about 5 seconds. The construction 10 may be under an inert gas (such as, for example, argon) during such anneal. In some embodiments, the anneal discussed above with reference to FIG. 6 may be omitted, and instead the source/drain region dopant may be annealed during the anneal of FIG. 10.

Figure 11:
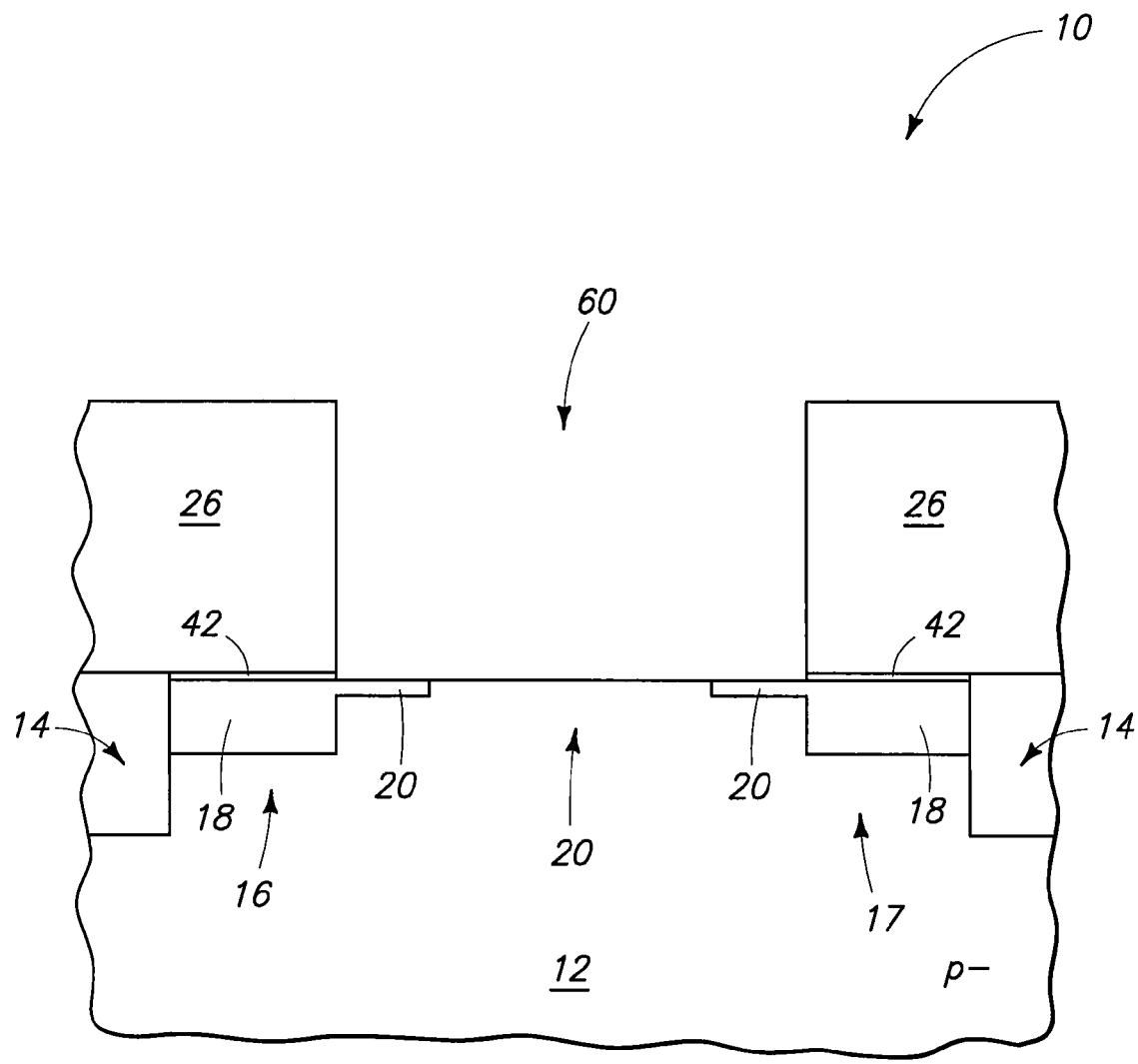

Referring to FIG. 11, sacrificial structures 50 (FIG. 10) are removed to laterally expand opening 60. In some embodiments, sacrificial structures 50 and sacrificial oxide 42 (FIG. 10) both consist of silicon dioxide, and both are simultaneously removed with an etch selective relative to base 12 and material 26. The exposed sidewalls of material 26 may be exposed to an etch to make the sidewalls relatively vertical (as shown) after removal of spacers 50, or in other embodiments (not shown) may remain with a curve (shown in FIG. 10) complementary to a lateral periphery of the spacers 50.

Figure 12:
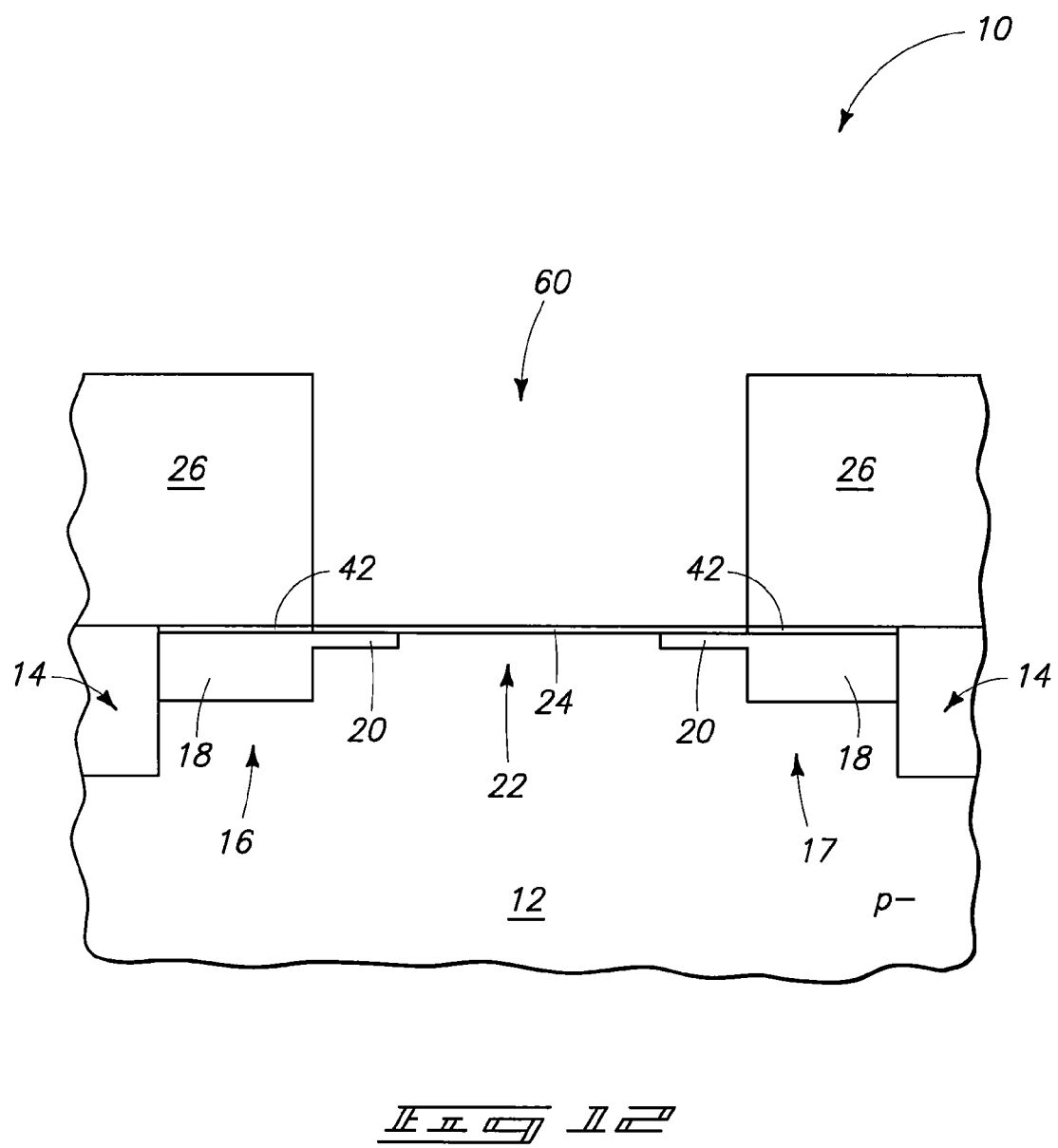

Referring to FIG. 12, gate dielectric 24 is formed across base 12 at the bottom of opening 60. Gate dielectric 24 may comprise any suitable composition or combination of compositions, and may, for example, comprise, consist essentially of, or consist of silicon dioxide. Gate dielectric 24 may be formed by, for example, thermal oxidation, ALD or CVD. In some embodiments, gate dielectric 24 may consist of silicon dioxide, and may be formed to a thickness of about 3.5 nanometers.

Figure 13:
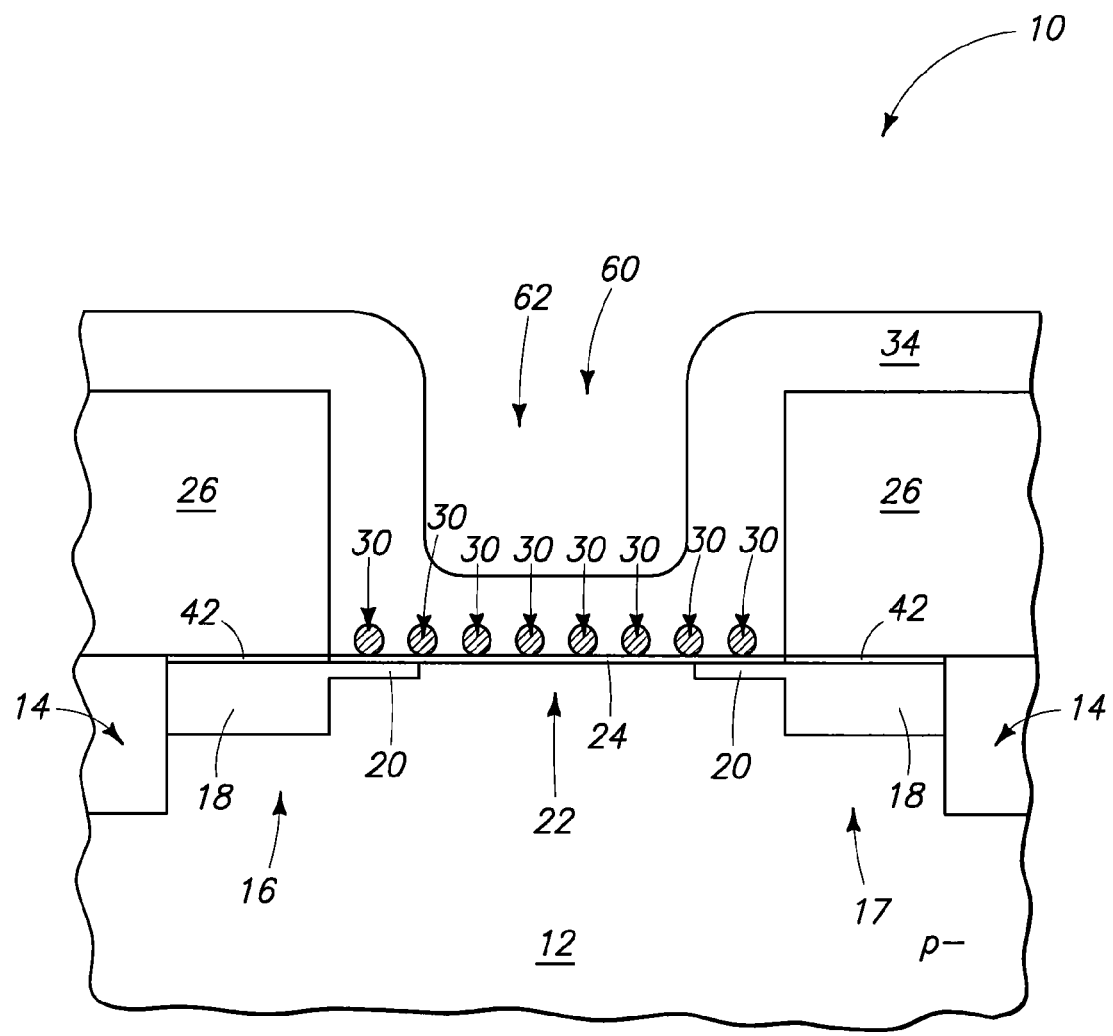

Referring to FIG. 13, charge-trapping islands 30 are formed within opening 60 and over gate dielectric 24. Charge trapping islands 30 may be nanosized particles, and in some embodiments may be nanocrystals and/or nanodots. The charge-trapping islands may comprise any suitable composition or combination of compositions; and in some embodiments may comprise, consist essentially of, or consist of one or more of Au, Ag, Co, Ge, Ir, Ni, Pb, Pd, Pt, Re, Ru, Se, Si, Ta, Te, Ti and W.

The charge-trapping islands are preferably of uniform size, and are uniformly distributed across the bottom of opening 60. The charge-trapping islands may be formed by any suitable processing, including, for example, aerosol distribution and/or co-deposition with dielectric material 34. However, a method which may be particularly suitable is to utilize chaperonin proteins to form a template which retains charge-trapping material as islands of desired size and distribution along the bottom of opening 60. The utilization of the chaperonin protein may comprise techniques described by S. Tang (S. Tang et. al., IEEE IEDM 2005, "Nanocrystal Flash Memory Fabricated With Protein-Mediated Assembly", pages 174-177). In some embodiments, the construction of FIG. 12 may be immersed in a phenyltriethoxysilane solution to pretreat the surface of tunnel dielectric 24. Subsequently, the wafer is floated upside down on a chaperonin protein solution to form a chaperonin template material across the tunnel dielectric. The chaperonin template material may have uniformly distributed cavities therein, with the cavities being of uniform size to retain charge trapping material as charge trapping islands. The chaperonin template material may be configured to retain any of numerous desired compositions of charge trapping material, and may, in some embodiments, be particularly suited for retaining charge trapping material consisting of cobalt or lead selenide.

After the chaperonin is utilized to retain the charge-trapping islands along dielectric 24, the chaperonin may be removed to leave the charge-trapping islands uniformly distributed across dielectric 24. The removal of the chaperonin may comprise low-temperature oxidation (ashing) of the chaperonin. For instance, the chaperonin may be oxidized by exposure to ozone and/or other oxidant at a temperature of about 200° C.

The high temperature annealing of the dopant has been conducted prior to formation of nanosized material 30, and accordingly a wide variety of compositions may be chosen for material 30 which would be unavailable in conventional processing in which nanocrystalline charge trapping centers are subsequently exposed to high temperature processing (i.e., processing of equal to or greater than 600° C.). Among the compositions that may be utilized for charge trapping centers of the present invention, and that may be problematic for utilization in processes in which they were exposed to high-temperature processing, are centers comprising, consisting essentially of, or consisting of metal.

Dielectric material 34 is formed over and between the islands 30 of charge-trapping material. Dielectric material 34 may comprise any suitable composition or combination of compositions, and may, for example, comprise silicon dioxide or high-k dielectric (with high-k dielectric being a composition having a dielectric constant greater than that of silicon dioxide). The dielectric material may be non-charge-trapping (for instance, silicon dioxide), or at least a portion of the dielectric material may be charge-trapping (for instance, silicon nitride). Although the dielectric material 34 is shown to be homogeneous, in other embodiments it may comprise two or more distinct layers of differing composition relative to one another.

Dielectric material 34 may be formed by any suitable method, including, for example, CVD or ALD. In some embodiments dielectric material 34 may consist of silicon dioxide formed by low pressure chemical vapor deposition, and may be formed to a thickness of about 12 nanometers. In the shown embodiment, dielectric material 34 is formed over electrically insulative material 26, as well as within opening 60. The dielectric material 34 only partially fills the opening, and thus narrows opening 60. Alternatively, the dielectric material may be considered to form an upwardly open container within opening 60, with such container defining a trough 62 therein.

Figure 14:
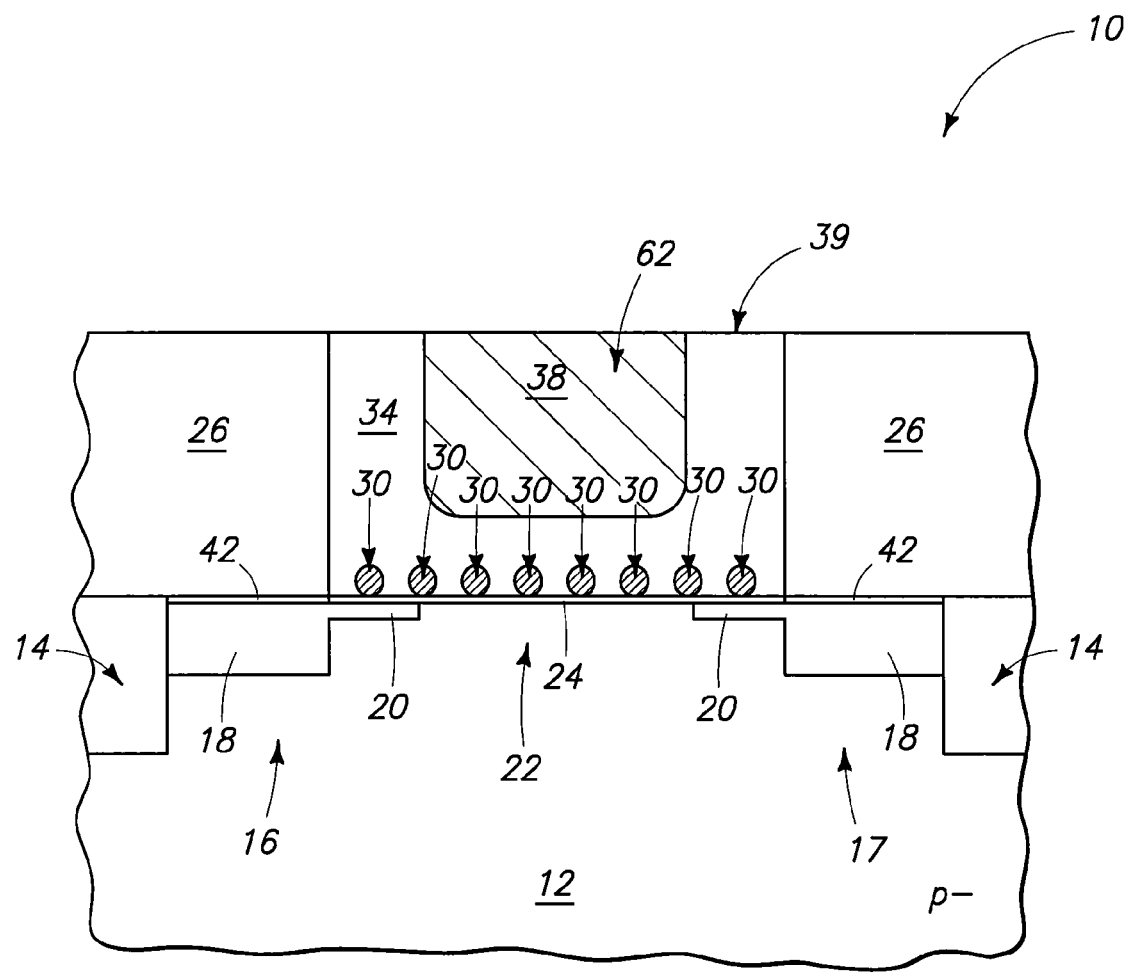

Referring to FIG. 14, control gate material 38 is formed within trough 62, and subsequently materials 26, 34 and 38 are subjected to planarization. The planarization removes material 34 from over material 26, and forms the planarized upper surface 39. The construction of FIG. 14 is identical to that of FIG. 1.

The control gate material 38 may comprise any suitable composition or combination of compositions. The high temperature annealing of the dopant has been conducted prior to formation of the control gate material, and accordingly a wide variety of compositions may be chosen for the control gate material which would be unavailable in processing in which the control gate material is subsequently exposed to high temperature processing. Among the compositions that may be utilized for control gate material of the present invention, and that may be problematic for utilization in processes in which they were exposed to high-temperature processing, are control gate materials comprising, consisting essentially of, or consisting of metal.

Figure 15:
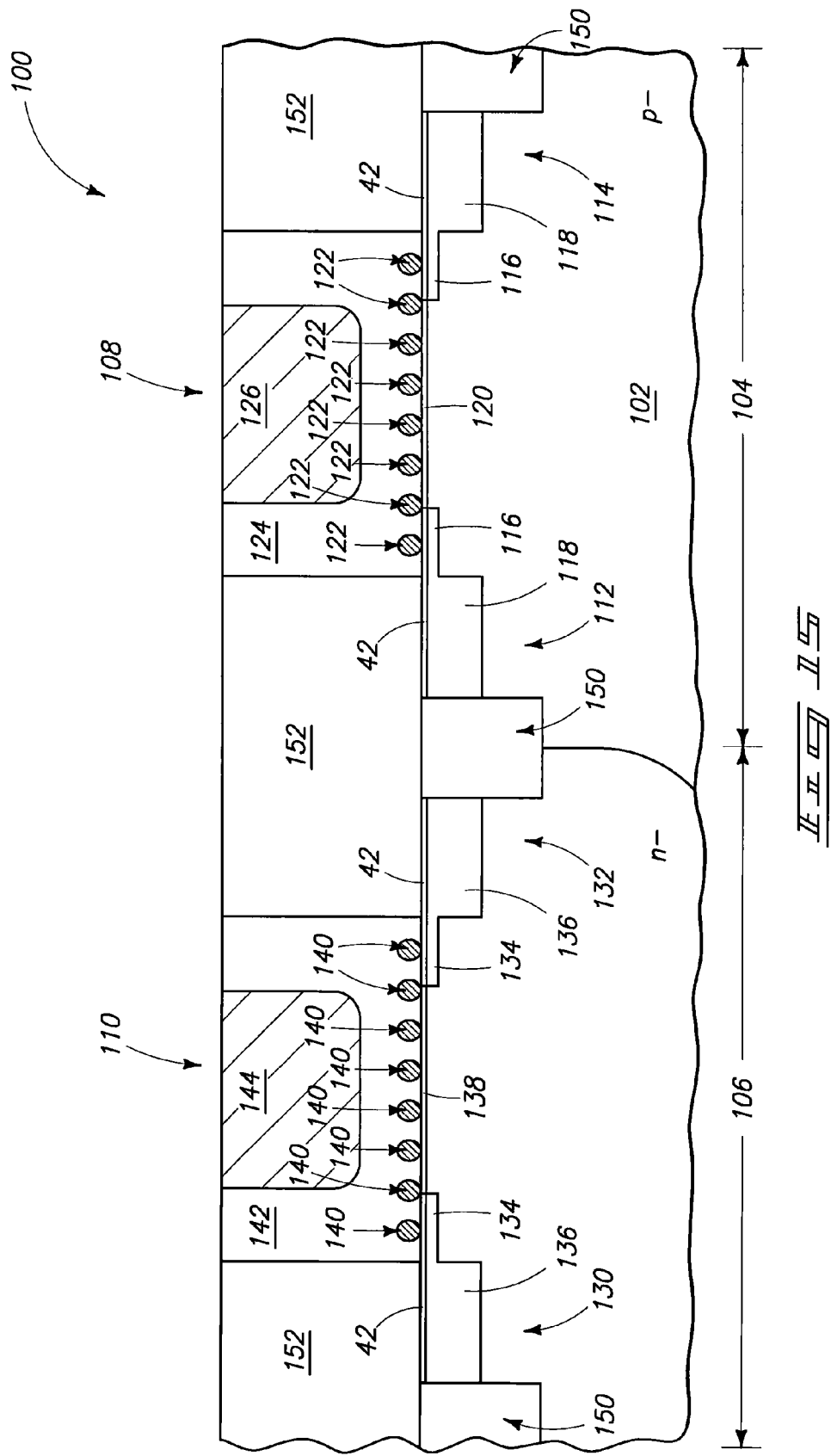
FIG. 15 is a diagrammatic, cross-sectional view of a portion of a semiconductor wafer illustrating an embodiment of a pair of memory cells of a CMOS.

The processing of FIGS. 2-14 is described as forming a single nonvolatile memory cell structure. In some embodiments, large arrays of such structures may be formed to create memory arrays. In other embodiments, at least some of the structures may be formed as CMOS pairs. The nonvolatile structures of the CMOS pairs may be utilized for logic applications, but may still be referred to as memory cells in that they store and transfer data even during logic applications. FIG. 15 shows an example embodiment in which a pair of structures of the type described above with reference to FIGS. 2-14 are combined in a CMOS configuration. Specifically, FIG. 15 shows a construction 100 comprising a semiconductor base 102 that is subdivided amongst a p-type background doped region 104 and an n-type background doped region 106. The n-type region may be an n-well formed in a background p-type doped monocrystalline wafer.

An NMOS-type structure 108 is over p-type doped region 104, and a PMOS-type structure 110 is over n-type doped region 106.

The NMOS-type structure 108 comprises source/drain regions 112 and 114 that contain lightly-doped extensions 116 and heavily-doped portions 118. The heavily-doped portions are majority n-type doped.

The NMOS-type structure 108 also comprises gate dielectric 120, charge-trapping islands 122, control dielectric 124, and a control gate 126. The gate dielectric, charge-trapping islands, control dielectric and control gate may comprise any of the compositions discussed in FIGS. 2-14 for analogous structures.

The PMOS-type structure 110 comprises source/drain regions 130 and 132 that contain lightly-doped extensions 134 and heavily-doped portions 136. The heavily-doped portions are majority p-type doped.

The PMOS-type structure 110 also comprises gate dielectric 138, charge-trapping islands 140, control dielectric 142, and a control gate 144. The gate dielectric, charge-trapping islands, control dielectric and control gate may comprise any of the compositions discussed in FIGS. 2-14 for analogous structures, and may be the same or different in composition relative to the NMOS-type gate dielectric 120, charge-trapping islands 122, control dielectric 124, and a control gate 126, respectively.

Trenched isolation regions 150 extend into base 102 adjacent the source/drain regions. Electrically insulative material 152 is over base 102. The electrically insulative material 152 is adjacent and between the NMOS and PMOS type structures 108 and 110. The material 152 may comprise the same compositions discussed above for material 26.

The NMOS and PMOS type structures 108 and 110 may be formed utilizing processing analogous to that discussed above relative to FIGS. 2-14. In such processing, the background n-type dopant of the n-well may be annealed together with the source/drain region dopants prior to formation of the charge-trapping islands.

The various structures discussed above with reference to FIGS. 1-15 may be incorporated into flash memory arrays and/or processor circuitry in some embodiments. Such memory arrays and processor circuitry may be utilized in a wide variety of electronic systems. Some example electronic systems are described with reference to FIGS. 16-19.

Figure 16:
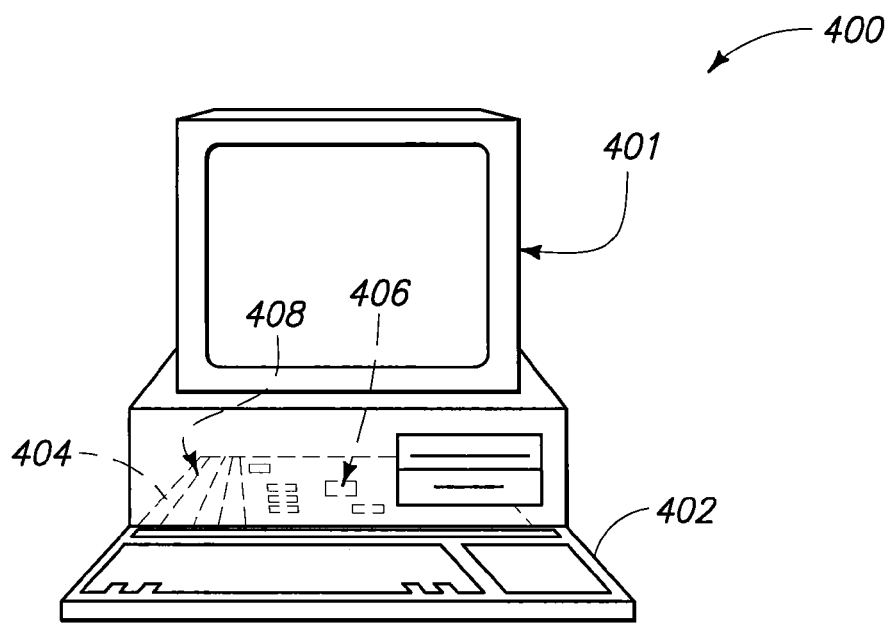
FIG. 16 is a diagrammatic view of a computer embodiment.
Figure 17:
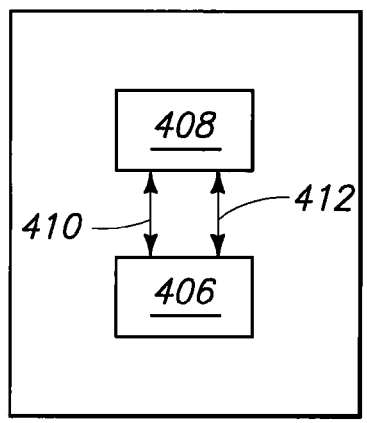
FIG. 17 is a block diagram showing particular features of the motherboard of the FIG. 16 computer embodiment.

FIG. 16 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 17. In such block diagram, the addressing circuitry is illustrated as 410 and the read circuitry is illustrated as 412.

Processor device 406 may correspond to a processor module, and associated memory utilized with the module may comprise flash structures.

Memory device 408 may correspond to a memory module, and may comprise flash memory.

FIG. 18 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include flash memory, such as a flash card.

FIG. 19 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include flash memory.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a memory cell, comprising:
   forming a sacrificial construction over a semiconductor substrate;
   using the sacrificial construction as a mask while implanting dopant into the semiconductor substrate to form implant regions;
   forming first electrically insulative material laterally outward of the sacrificial construction;
   removing the sacrificial construction to leave an opening extending through the first electrically insulative material, the opening having a periphery comprising sidewalls extending upwardly from a bottom;
   forming gate dielectric material along the bottom of the opening periphery;
   annealing the dopant within the implant regions;
   after annealing the dopant, distributing nanosize charge trapping units within the opening and over the gate dielectric material;
   forming second electrically insulative material within the opening, the second electrically insulative material being over and between the nanosize charge trapping units; the second electrically insulative material only partially filling the opening to line the sidewalls and bottom of the periphery of the opening; the lined opening having a trough extending therein; and
   forming control gate material within said trough.

2. The method of claim 1 wherein the sacrificial construction comprises polycrystalline silicon.

3. The method of claim 1 wherein the nanosize charge trapping units are a plurality of laterally spaced structures, and wherein the distributing the nanosize charge trapping units comprises:
   forming chaperonin protein template material within the opening;
   retaining charge trapping material within the chaperonin protein template material; and
   removing the chaperonin protein template material to leave the laterally spaced structures comprising the charge trapping material.

4. The method of claim 3 wherein the removing of the chaperonin protein template material comprises oxidation of the chaperonin protein template material.

5. The method of claim 3 wherein the charge trapping material comprises cobalt or lead selenide.

6. The method of claim 1 wherein the control gate material consists of metal.

7. A method of forming a memory cell, comprising:
   forming a first sacrificial structure over a semiconductor substrate;
   using the first sacrificial structure as a first mask while implanting first dopant into the semiconductor substrate to form lightly doped portions of a pair of source/drain regions, the individual source drain regions of said pair being spaced from one another by a channel region location beneath the first mask;
   forming second sacrificial structures along opposing sidewalls of the first sacrificial structure;
   using the combined first and second sacrificial structures as a second mask while implanting second dopant to form heavily doped portions of the source/drain regions;
   forming an electrically insulative material laterally along the second mask;
   removing the first sacrificial structure to form a first opening extending between the second sacrificial structures;
   implanting third dopant into the first opening to form a threshold voltage implant within the channel region location;
   removing the second sacrificial structures to laterally expand the first opening into a second opening that extends through the electrically insulative material;
   annealing the first, second and third dopants; and
   after annealing the first, second and third dopants, forming nanosize charge trapping units within the second opening, forming dielectric material within the second opening and over the charge trapping units, and forming control gate material within the second opening and over the dielectric material.

8. The method of claim 7 wherein the first sacrificial structure comprises polycrystalline silicon.

9. The method of claim 7 wherein the second sacrificial structures comprise silicon dioxide.

10. The method of claim 9 wherein the first opening extends to a sacrificial oxide layer, and wherein the sacrificial oxide layer is removed simultaneously with the removing of the second sacrificial structures.

11. The method of claim 10 further comprising forming gate oxide material within the opening after removing the second sacrificial structures and the sacrificial oxide layer, and wherein the nanosize charge trapping units are formed over the gate oxide material.

12. The method of claim 7 wherein the electrically insulative material comprises silicon nitride.

13. The method of claim 7 wherein the forming the electrically insulative material comprises:
   forming the electrically insulative material over the second mask and laterally along the second mask; and
   removing the electrically insulative material from over the second mask while leaving the electrically insulative material laterally along the second mask.

14. The method of claim 13 wherein the removing the electrically insulative material from over the second mask utilizes chemical-mechanical polishing.

15. The method of claim 13 wherein the dielectric material is formed to extend over the electrically insulative material as well as within the second opening.

* * * * *